(12) United States Patent
Cross et al.

(10) Patent No.: US 10,262,831 B2
(45) Date of Patent: Apr. 16, 2019

(54) METHOD AND SYSTEM FOR WEAK PATTERN QUANTIFICATION

(71) Applicant: KLA-Tencor Corporation, Milpitas, CA (US)

(72) Inventors: Andrew Cross, Cheshire (GB); Allen Park, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/729,458

(22) Filed: Oct. 10, 2017

(65) Prior Publication Data
US 2018/0174797 A1 Jun. 21, 2018

Related U.S. Application Data

(60) Provisional application No. 62/437,585, filed on Dec. 21, 2016.

(51) Int. Cl.
| | |
|---|---|
| *H01J 37/26* | (2006.01) |
| *H01L 21/66* | (2006.01) |
| *G06T 7/00* | (2017.01) |
| *G03F 7/20* | (2006.01) |

(52) U.S. Cl.
CPC .......... *H01J 37/268* (2013.01); *G03F 7/7065* (2013.01); *G06T 7/001* (2013.01); *H01L 22/12* (2013.01); *H01J 2237/2817* (2013.01)

(58) Field of Classification Search
CPC ................ G03F 7/7065; G06T 7/001; H01J 2237/2817; H01J 37/268; H01L 22/12
See application file for complete search history.

(56) References Cited

U.S. PATENT DOCUMENTS

| | | | |
|---|---|---|---|
| 2012/0002861 | A1 | 1/2012 | Nishiura et al. |
| 2015/0060667 | A1 | 3/2015 | Yamaguchi et al. |
| 2016/0284579 | A1 | 9/2016 | Kaizerman et al. |

FOREIGN PATENT DOCUMENTS

| | | |
|---|---|---|
| JP | 2005259830 A | 9/2005 |
| KR | 20120066158 A | 6/2012 |

OTHER PUBLICATIONS

International Search Report and Written Opinion dated May 8, 2018 for PCT/US2018/015104.

*Primary Examiner* — Tri T Ton
(74) *Attorney, Agent, or Firm* — Suiter Swantz pc llo

(57) ABSTRACT

A weak pattern identification method includes acquiring inspection data from a set of patterns on a wafer, identifying failing pattern types on the wafer, and grouping like pattern types of the failing pattern types into a set of pattern groups. The weak pattern identification method also includes acquiring image data from multiple varied instances of a first pattern type grouped in a first group, wherein the multiple varied instances of the first pattern type are formed under different conditions. The weak pattern identification method also includes comparing images obtained from common structures of the instances of the first pattern type to identify local differences within a portion of the first pattern type. Further, the weak pattern identification method includes identifying metrology sites within the portion of the first pattern type proximate to a location of the local differences within the portion of the first pattern type.

31 Claims, 8 Drawing Sheets

METHOD AND SYSTEM FOR WEAK PATTERN QUANTIFICATION

CROSS-REFERENCE TO RELATED APPLICATION

The present application claims the benefit under 35 U.S.C. § 119(e) of U.S. Provisional Application Ser. No. 62/437,585, filed Dec. 21, 2016, entitled STRUCTURE QUANTIFICATION THROUGH IMAGE PROCESS AND COMPARISON, naming Andrew Cross and Allen Park as inventors, which is incorporated herein by reference in the entirety.

TECHNICAL FIELD

The present invention generally relates to sample inspection and identification of failing patterns on a semiconductor wafer, and, more particularly, to the identification of failing patterns on a semiconductor wafer through the comparison of pattern instances formed under modulated or varying conditions.

BACKGROUND

The need for improved semiconductor inspection and review tools continues to grow. For example, there is a need for improved quantification of defects detected by optical and SEM based inspection methods. Due to semiconductor device design rules (14 nm (production), 10 nm (pilot) and 7 nm (R&D)) and the complexity associated with multi-patterning the ability to distinguish a defect from potential noise is a significant challenge. Distinguishing a defect from noise is even more challenging in the case of systematic defects that may be related to subtle variations of critical patterns. Currently, optical and SEM inspection methods, such as process window discovery, are used to identify such systematic defects and sample these 'hot spots' for review. This approach relies on the use of modulated fields within a wafer to cause the weakest structures to fail in order to enhance detection, allowing for the identification of the edge of the process window.

Hot spots detected by optical inspection must be verified by a defect review tool, such as a scanning electron microscopy (SEM) review tool, to localize the exact point of failure and understand whether the failure will have a significant impact on the device. Typically, SEM review tools have been used for classification of defects by binning the defects into different bins based on defect type. In the case of hot spot classification, manual classification is typically employed to group defects into good, bad and marginal classes, which may be subjective. Recent advances have provided for the incorporation of design information in design-assisted automatic classification. Nevertheless, even in design-assisted classification, a vast amount of information is lost due to the inability to specifically quantify features in SEM review images. Feature quantification is particularly important in understanding pattern fidelities at the current advanced design rule nodes and future nodes. Therefore, it would be desirable to provide a system and method for curing the shortcomings of prior approaches such as those identified above.

SUMMARY

A method for weak pattern quantification in semiconductor device fabrication is disclosed, in accordance with one or more embodiments of the present disclosure. In one embodiment, the method includes acquiring inspection data from a set of patterns on a wafer. In another embodiment, the method includes identifying one or more failing pattern types on the wafer based on the acquired inspection data. In another embodiment, the method includes grouping like pattern types of the one or more failing pattern types into a set of pattern groups. In another embodiment, the method includes acquiring image data from two or more varied instances of a first pattern type grouped in a first group of the set of pattern groups, wherein the two or more varied instances of the first pattern type are formed with different conditions. In another embodiment, the method includes comparing two or more images obtained from one or more common structures of the two or more instances of the first pattern type to identify one or more local differences within a portion of the first pattern type. In another embodiment, the method includes identifying one or more metrology sites within the portion of the first pattern type proximate to a location of the one or more local differences within the portion of the first pattern type.

A system for weak pattern quantification in semiconductor device fabrication is disclosed, in accordance with one or more embodiments of the present disclosure. In one embodiment, the system includes an inspection tool. In another embodiment, the system includes a review tool. In another embodiment, the system includes a controller including one or more processors configured to execute a set of program instructions maintained on a memory. In another embodiment, the program instructions are configured to cause the one or more processors to direct the inspection tool to acquire inspection data from a set of patterns on a wafer. In another embodiment, the program instructions are configured to cause the one or more processors to identify one or more failing pattern types on the wafer based on the acquired inspection data. In another embodiment, the program instructions are configured to cause the one or more processors to group like pattern types of the one or more failing pattern types into a set of pattern groups. In another embodiment, the program instructions are configured to cause the one or more processors to direct the review tool to acquire image data from two or more modulated instances of a first pattern type grouped in a first group of the set of pattern groups, wherein the two or more modulated instances of the first pattern type are formed with different conditions. In another embodiment, the program instructions are configured to cause the one or more processors to compare two or more images obtained from one or more common structures of the two or more instances of the first pattern type to identify one or more local differences within a portion of the first pattern type. In another embodiment, the program instructions are configured to cause the one or more processors to identify one or more metrology sites within the portion of the first pattern type proximate to a location of the one or more local differences within the portion of the first pattern type.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Figure 1A:
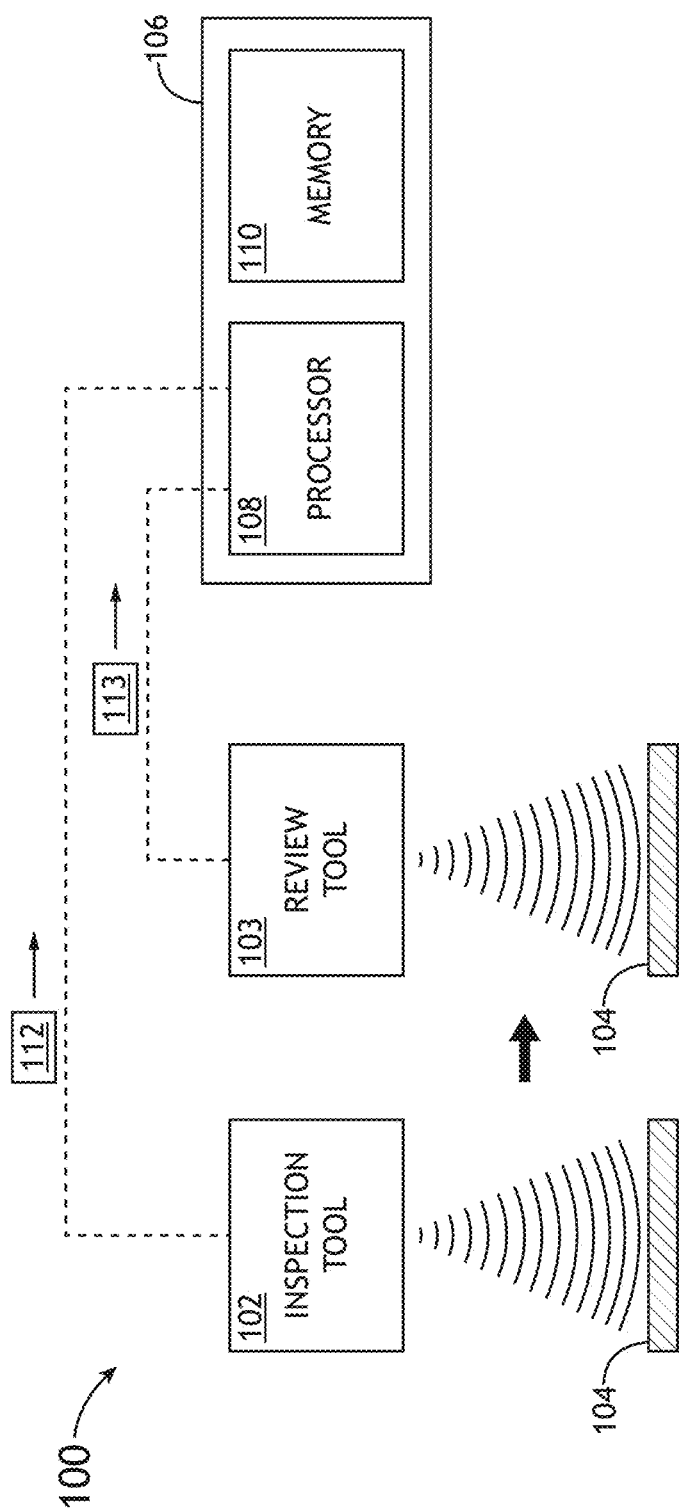
FIG. 1A is a conceptual view of a system for weak pattern quantification, in accordance with one or more embodiments of the present disclosure.

Reference will now be made in detail to the subject matter disclosed, which is illustrated in the accompanying drawings.

Referring generally to FIGS. 1 through 5, a system and method for the quantification of weak or failing patterns of a semiconductor device is described in accordance with the present disclosure.

Embodiments of the present disclosure are directed to an image-based approach to weak pattern quantification in semiconductor devices, which includes the collection of images from modulated patterns (i.e., patterns formed under different conditions). The modulated patterns may be formed deliberately on a modulated wafer used during process window discovery. Alternatively, the modulated patterns may be formed on a nominal product wafer. The modulated patterns may be used to automatically identify where within a structure a failure or pattern variation is occurring. In turn, embodiments of the present disclosure provide for the automated insertion of a measurement site on the failure area of the structure. Additional embodiments of the present disclosure are directed to the augmentation of the pattern quantification process with design data and/or process simulation results.

It is noted that with a set of sampling rules a measurement sample plan may be devised and automated to enable the generation of data on 10,000 to 1,000,000 structures, which is significantly more than the approximately 1,000 structures that are manually classifiable with current approaches. Embodiments of the present disclosure require little manual input, allowing users to devote time to analysis of the generated data rather than the generation of the data itself. Such an approach allows a user to more accurately determine which patterns are most important and have the largest impact on the process window, and define that process window. This capability enables improved systematic defect discovery and monitoring on nominal wafers to allow new discovery methods based on large sample sets. Automation of image quantification enables statistically valid samples between different wafers for process splits to be evaluated with image quantification techniques.

FIG. 1 illustrates a conceptual view of a system 100 for quantification of weak patterns on a semiconductor wafer, in accordance with one embodiment of the present disclosure. In one embodiment, the system 100 includes an inspection tool 102 and a review tool 103. In another embodiment, the system 100 includes a controller 106 communicatively coupled to the inspection tool 102 and the review tool 103.

The inspection tool 102 may include any inspection tool or system known in the art of sample inspection or imaging, such as, but not limited to, an optical inspection tool or an electron-beam inspection tool. For example, in the case of an optical based inspection tool, the inspection sub-system may include a broadband inspection tool. For instance, the inspection tool 102 may include, but is not limited to, a broadband plasma (BBP) inspection tool. By way of another example, in the case of an electron-beam based inspection tool, the inspection tool may include a scanning electron microscopy (SEM) tool. The SEM tool may include any SEM tool known in the art of wafer inspection and review.

The review tool 103 may include any review tool or system known in the art of sample review or classification. For example, the review tool 103 may include, but is not limited to, an SEM review tool.

It is noted herein that for purposes of simplicity the system 100 been depicted in FIG. 1 in the form of a conceptual block diagram. This depiction, including the components and optical configuration, is not limiting and is provided for illustrative purposes only. The inspection tool 102 and review tool 103 may include any number of components necessary to carry out the inspection and/or review processes described herein.

Figure 1B:
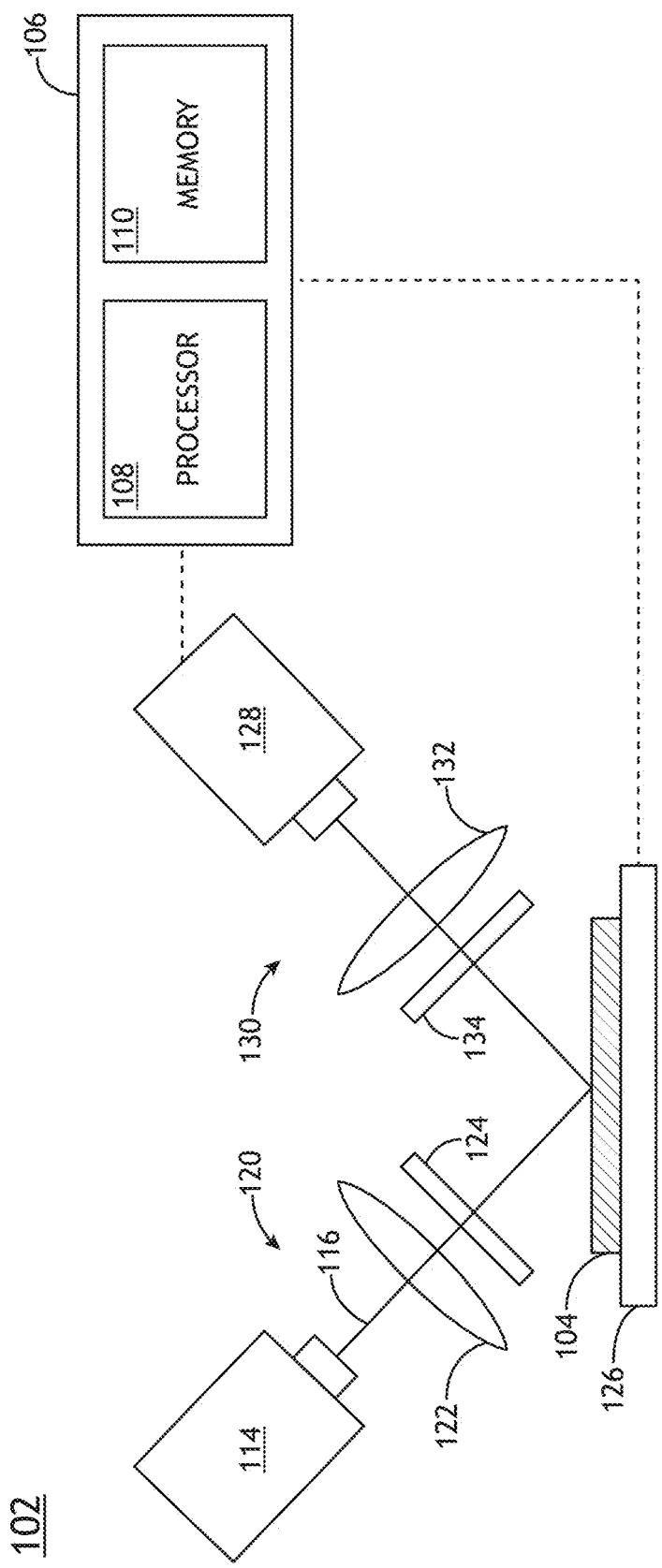
FIGS. 1B-1C are simplified schematic views of an optical inspection tool, in accordance with one or more embodiments of the present disclosure.

FIG. 1B is a conceptual view of an inspection tool 102 for scanning a focused optical illumination beam across a surface of a sample, in accordance with one or more embodiments of the present disclosure.

In one embodiment, the inspection tool 102 includes an illumination source 114 to generate an illumination beam 116. The illumination beam 116 may include one or more selected wavelengths of light including, but not limited to, ultraviolet (UV) radiation, visible radiation, or infrared (IR) radiation.

The illumination source 114 may be any type of illumination source known in the art suitable for generating an optical illumination beam 116. In one embodiment, the illumination source 114 includes a broadband plasma (BBP) illumination source. In this regard, the illumination beam 116 may include radiation emitted by a plasma. For example, a BBP illumination source 114 may include, but is not required to include, one or more pump sources (e.g., one or more lasers) configured to focus into the volume of a gas, causing energy to be absorbed by the gas in order to generate or sustain a plasma suitable for emitting radiation. Further, at least a portion of the plasma radiation may be utilized as the illumination beam 116.

In another embodiment, the illumination source 114 may include one or more lasers. For instance, the illumination source 114 may include any laser system known in the art capable of emitting radiation in the infrared, visible, or ultraviolet portions of the electromagnetic spectrum.

The illumination source 114 may further produce an illumination beam 116 having any temporal profile. For example, the illumination source 114 may produce a continuous illumination beam 116, a pulsed illumination beam 116, or a modulated illumination beam 116. Additionally, the illumination beam 116 may be delivered from the illumination source 114 via free-space propagation or guided light (e.g., an optical fiber, a light pipe, or the like).

In another embodiment, the illumination source 114 directs the illumination beam 116 to a wafer 104 via an illumination pathway 120. The illumination pathway 120 may include one or more illumination pathway lenses 122 or additional optical components 124 suitable for modifying and/or conditioning the illumination beam 116. For example, the one or more optical components 124 may include, but are not limited to, one or more polarizers, one or more filters, one or more beam splitters, one or more diffusers, one or more homogenizers, one or more apodizers, or one or more beam shapers.

In another embodiment, the wafer 104 is disposed on a sample stage 126. The sample stage 126 may include any device suitable for positioning and/or scanning the wafer 104 within the inspection tool 102. For example, the sample stage 126 may include any combination of linear translation stages, rotational stages, tip/tilt stages, or the like.

In another embodiment, the inspection tool 102 includes a detector 128 configured to capture radiation emanating from the wafer 104 through a collection pathway 130. The collection pathway 130 may include, but is not limited to, one or more collection pathway lenses 132 for collecting radiation from the wafer 104. For example, a detector 128 may receive radiation reflected or scattered (e.g., via specular reflection, diffuse reflection, and the like) from the wafer 104 via one or more collection pathway lenses 132. By way of another example, a detector 128 may receive radiation generated by the wafer 104 (e.g., luminescence associated with absorption of the illumination beam 116, or the like). By way of another example, a detector 128 may receive one or more diffracted orders of radiation from the wafer 104 (e.g., 0-order diffraction, ±1 order diffraction, ±2 order diffraction, and the like).

The detector 128 may include any type of detector known in the art suitable for measuring illumination received from the wafer 104. For example, a detector 128 may include, but is not limited to, a CCD detector, a TDI detector, a photomultiplier tube (PMT), an avalanche photodiode (APD), or the like. In another embodiment, a detector 128 may include a spectroscopic detector suitable for identifying wavelengths of radiation emanating from the wafer 104.

The collection pathway 130 may further include any number of optical elements 134 to direct and/or modify collected illumination from the wafer 104 including, but not limited to, one or more collection pathway lenses 132, one or more filters, one or more polarizers, or one or more beam blocks.

Figure 1C:
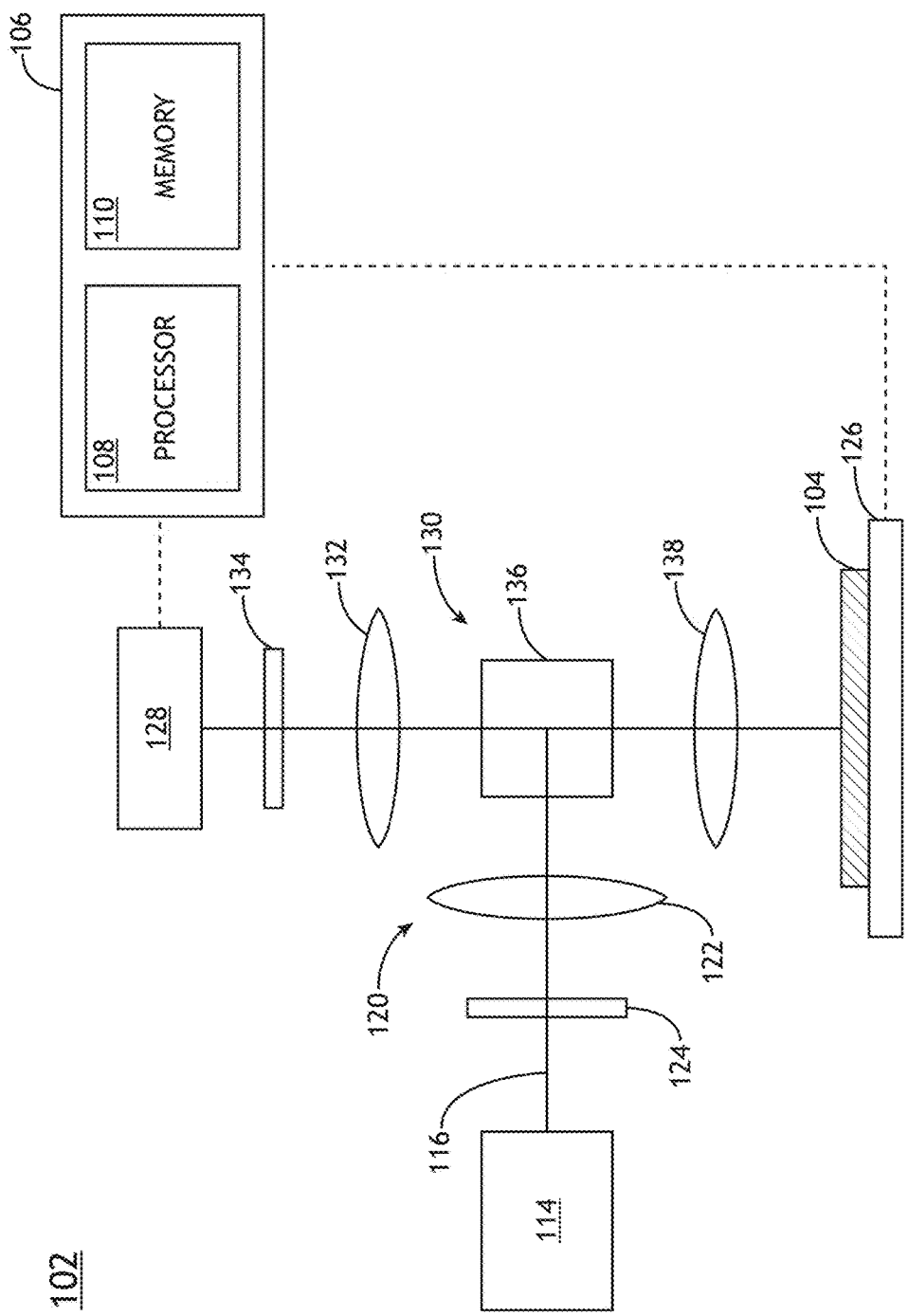

FIG. 1C is a conceptual view of the inspection tool 102 for imaging and/or scanning a sample, in accordance with one or more embodiments of the present disclosure. In one embodiment, the detector 128 is positioned approximately normal to the surface of the wafer 104. In another embodiment, the inspection tool 102 includes a beam splitter 136 oriented such that an objective lens 138 may simultaneously direct the illumination beam 116 to the wafer 104 and collect radiation emanating from the wafer 104. Further, the illumination pathway 120 and the collection pathway 130 may share one or more additional elements (e.g., objective lens 138, apertures, filters, or the like).

Examples of optical inspection tools are described in detail in U.S. Pat. No. 7,092,082, U.S. Pat. No. 6,702,302, U.S. Pat. No. 6,621,570 and U.S. Pat. No. 5,805,278, which are each incorporated herein by reference in the entirety.

Figure 1D:
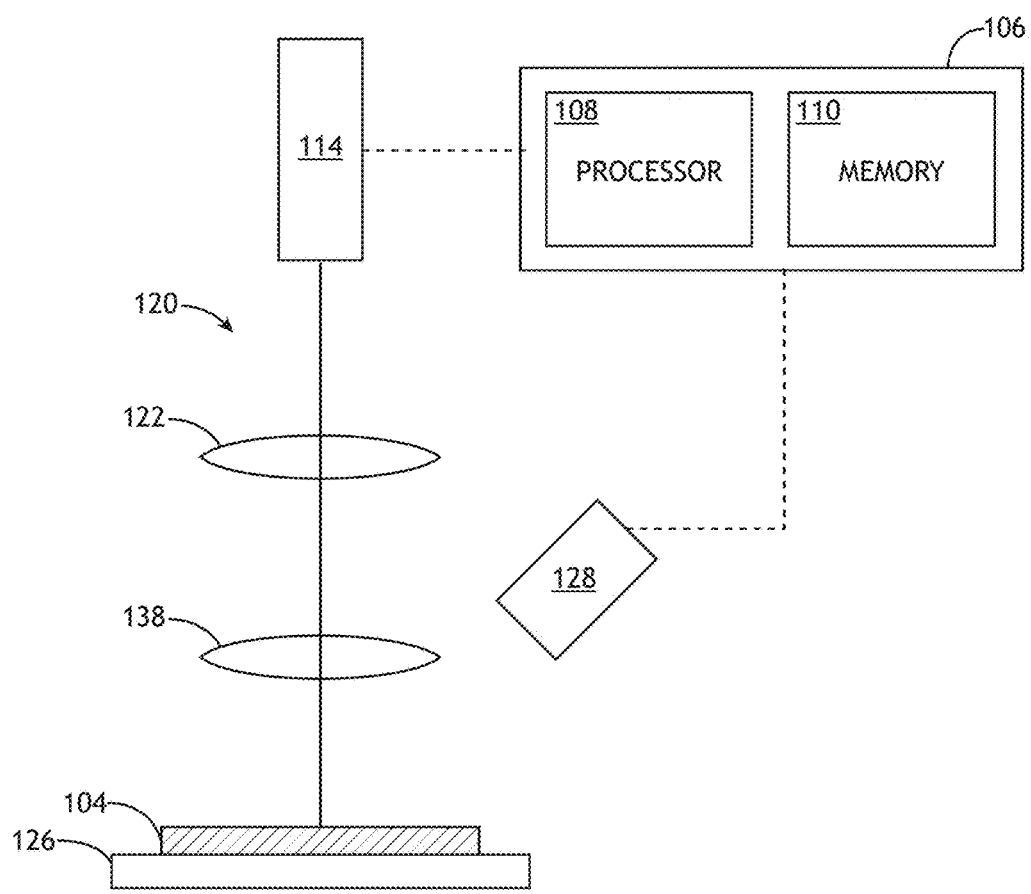
FIG. 1D is a simplified schematic view of a scanning electron microscopy inspection tool, in accordance with one or more embodiments of the present disclosure.

FIG. 1D is a conceptual view of the inspection tool 102 configured as a particle beam inspection system, in accordance with one or more embodiments of the present disclosure. For example, the inspection tool 102 may be, but is not required to be, configured as a scanning electron microscope (SEM). In one embodiment, the illumination source 114 includes a particle source (e.g., an electron beam source, an ion beam source, or the like) such that the illumination beam 116 includes a particle beam (e.g., an electron beam, a particle beam, or the like). The illumination source 114 may include any particle source known in the art suitable for generating an illumination beam 116. For example, the illumination source 114 may include, but is not limited to, an electron gun or an ion gun.

In another embodiment, the illumination pathway 120 includes one or more particle focusing elements (e.g., illumination pathway lenses 122, collection pathway lenses 132, or the like). For example, the one or more particle focusing elements may include, but are not limited to, a single particle focusing element or one or more particle focusing elements forming a compound system. In another embodiment, the one or more particle focusing elements include objective lens 138 configured to direct the illumination beam 116 to the wafer 104. Further, the one or more particle focusing elements may include any type of electron lenses known in the art including, but not limited to, electrostatic, magnetic, uni-potential, or double-potential lenses.

In another embodiment, the inspection tool 102 includes one or more particle detectors 128 to image or otherwise detect particles emanating from the wafer 104. In one embodiment, the detector 128 includes an electron detector (e.g., a secondary electron detector, a backscattered electron detector, or the like). In another embodiment, the detector 128 includes a photon detector (e.g., a photodetector, an x-ray detector, a scintillating element coupled to photomultiplier tube (PMT) detector, or the like) for detecting electrons and/or photons from the sample surface.

In another embodiment, the review tool 103 may also be configured as a particle beam system, such as that depicted in FIG. 1D. For example, the review tool 103 may include, but is not limited to, an SEM review tool.

In another embodiment, the controller 106 includes one or more processors 108. The one or more processors 108 may be configured to execute a set of program instructions stored in memory 110. In one embodiment, one or more processors 108 of the controller 106 are communicatively coupled to the inspection tool 102 and/or the review tool 103. For example, the one or more processors 108 of the controller 106 may be coupled to the output of one or more detectors of the inspection tool 102 and one or more detectors of the review tool 103. The one or more processors 108 of the controller 106 may be coupled to the inspection tool 102 and/or review tool 103 in any suitable manner (e.g., by one or more transmission media indicated by the line shown in FIG. 1A) such that the controller 106 can receive the inspection images 112 acquired from the wafer 104 via the inspection tool 102 and review images 113 acquired from the wafer 104 via the review tool 103.

In one embodiment, the inspection tool 102 is configured to perform one or more image acquisitions of one or more wafers 104. For example, the inspection tool 102 may acquire one or more inspection images 112 from one or more portions of the surface of the wafer 104. In this regard, the inspection tool 102 may acquire inspection data 112 from a set of patterns formed on the wafer 104.

Figure 2:
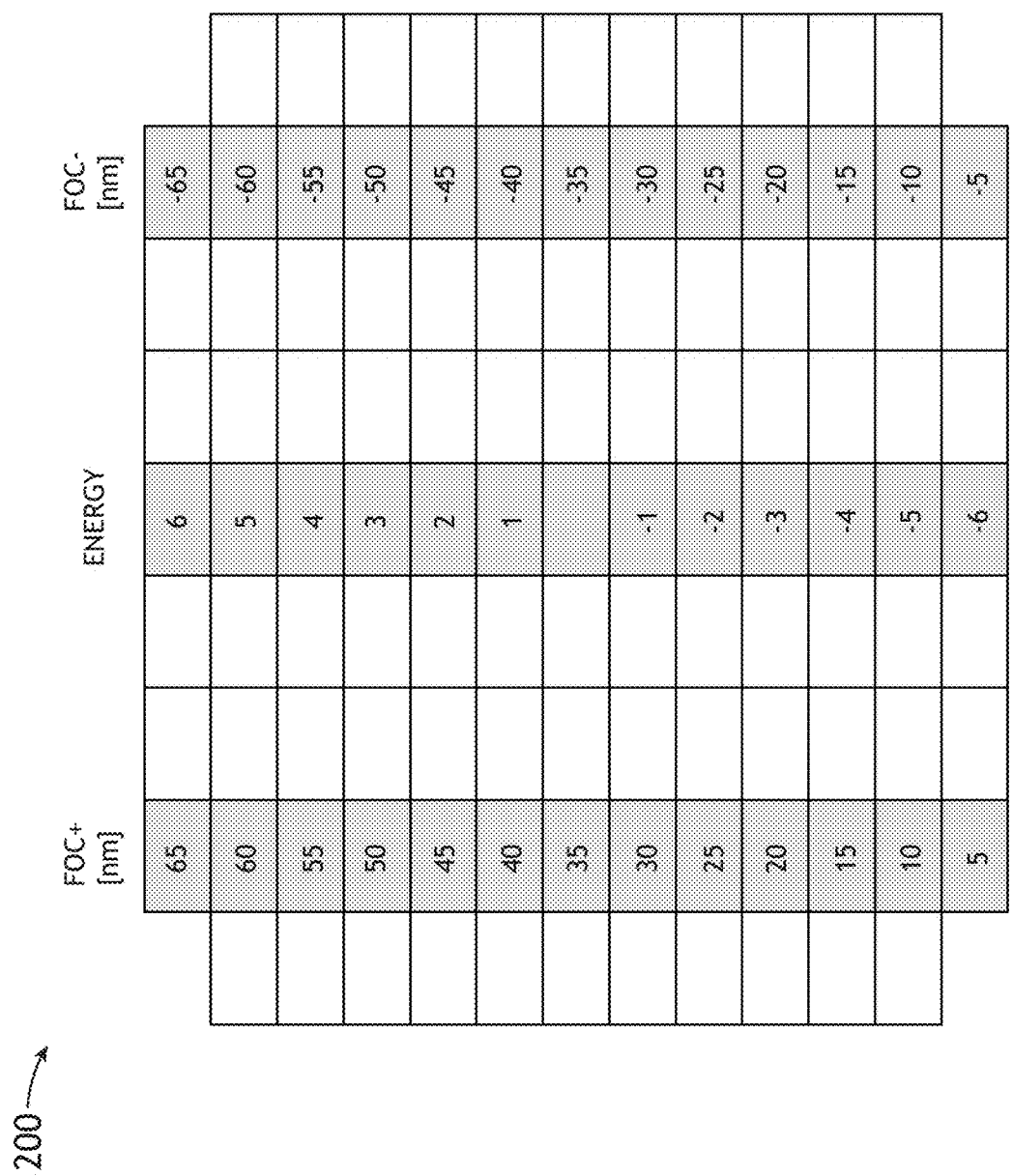
FIG. 2 is a top view of a modulated wafer, in accordance with one or more embodiments of the present disclosure.

In one embodiment, the inspection tool 102 may acquire the inspection data 112 from patterns formed on a modulated wafer. FIG. 2 depicts a modulated wafer 200 including patterns formed under varying focus and dose settings. In this regard, during process window discovery, the inspection tool 102 may collect images from the modulated wafer 200. In this regard, varied instances of a given pattern type may be formed deliberately on the modulated wafer 200, whereby a each pattern type is formed under different conditions (e.g., focus, dose, overlay, and the like). The variation of the formation conditions of the patterns allows the system 100 to analyze the condition boundaries suitable for pattern formation and to identify the weak or failing patterns for further analysis.

It is noted that the scope of the present disclosure is not limited to the use of a modulated wafer. In another embodiment, the inspection tool 102 may acquire the inspection data 112 from patterns formed on a nominal product wafer. In this regard, the patterns are formed on the wafer under different conditions due to incidental variations in wafer and process tool conditions.

In another embodiment, the inspection tool 102 transmits the inspection data 112 to the controller 106 via one or more data transmission links. For example, the inspection tool 102 may transmit the inspection data 112 to the one or more processors 108 and/or memory 110 of controller 106 for analysis and/or storage.

In another embodiment, the program instructions are configured to cause the one or more processors 108 to identify one or more failing pattern types on the wafer based on the acquired inspection data. In one embodiment, the failing pattern types may be identified during process window discovery. It is noted that a given hot spot inspection process may yield a large number of defect spots (e.g., 1-2 million). In one embodiment, inspection data may be compared to design data in order to carry out hot spot identification.

In another embodiment, the program instructions are configured to cause the one or more processors 108 to group similar failing pattern types. For example, the program instructions may be configured to cause the one or more processors 108 to group two or more structures of a first failing pattern type into a first group. By way of another example, the program instructions may be configured to cause the one or more processors 108 to group two or more structures of a second failing pattern type into a second group and so on.

Figure 3:
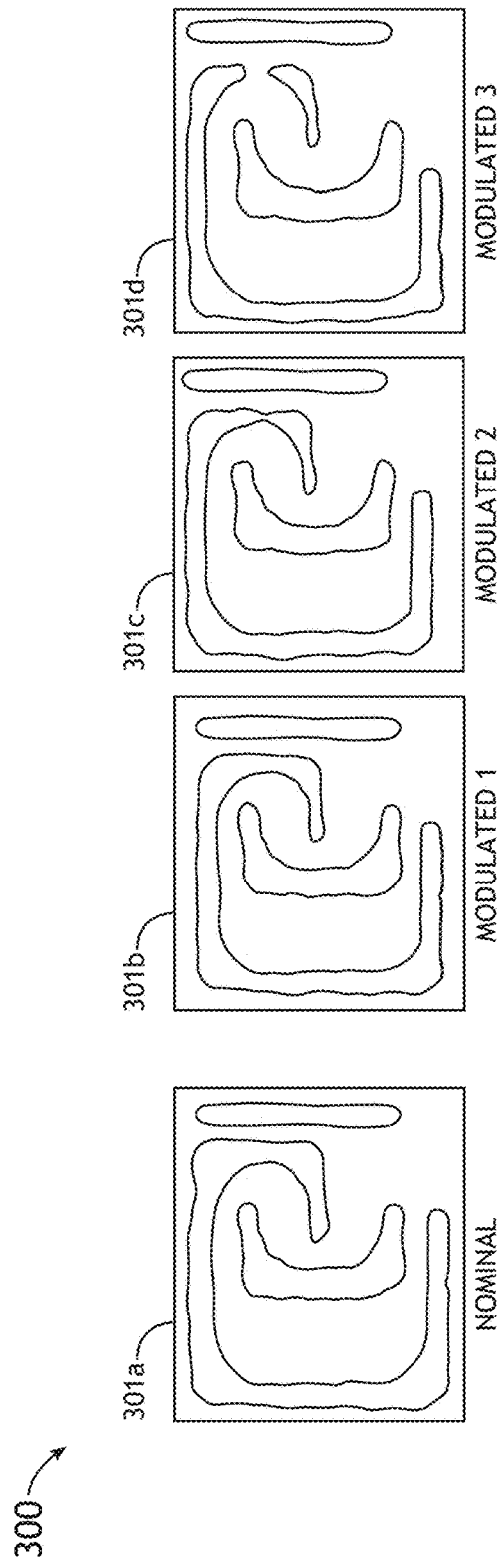
FIG. 3 is a conceptual view of a series of pattern structures depicting the failing of the particular pattern type, in accordance with one or more embodiments of the present disclosure.

In another embodiment, the program instructions are configured to cause the one or more processors 108 to direct the review tool 103 to acquire image data from two or more modulated instances of a first pattern type grouped in a first group of the set of pattern groups. It is noted that the two or more modulated instances of the first pattern type are formed under different conditions (e.g., focus, dose, overlay, and the like). For example, FIG. 3 illustrates a conceptual view 300 of a nominal pattern structure 301a, a first modulated pattern structure 301b, a second modulated pattern structure 301c, and a third modulated pattern structure 301d. In one embodiment, the modulated structures may be deliberately formed under different conditions on a modulated wafer. In another embodiment, the modulated structures may be incidentally formed on a product wafer under different conditions due to the variations in the various process conditions.

Figure 4A:
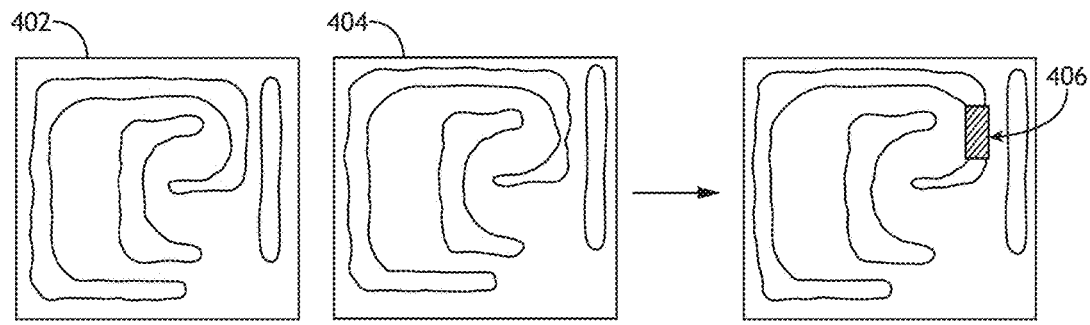
FIGS. 4A-4B are conceptual views of the identification of a weak pattern area based on a comparison between multiple instances of a particular pattern type, in accordance with one or more embodiments of the present disclosure.
Figure 4B:
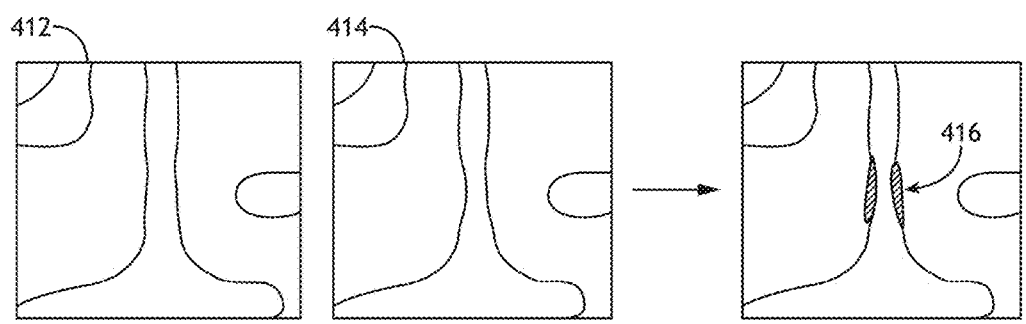

In another embodiment, the program instructions are configured to cause the one or more processors 108 to compare two or more images obtained from one or more common structures of the two or more instances of the first pattern type to identify one or more local differences within a portion of the first pattern type. For example, as shown in FIG. 4A, the one or more processors 108 may subtract image 404 from image 402 to identify the local difference 406 in the pattern. By way of another example, as shown in FIG. 4B, the one or more processors 108 may subtract image 414 from image 412 to identify the local difference 416 in the pattern. The comparison between a modulated image 404/414 and a nominal image 402/412 (or a comparison between two modulated images) provide for the identification of areas or sub-areas of a design element that are varying. In one embodiment, the one or more processors 108 may execute a diversity sampling process on one or more common structures of the two or more instances of the first pattern type to identify one or more local differences within a portion of the first pattern type. In another embodiment, the one or more processors may apply one or more edge smoothing techniques to minimize pattern noise prior to image subtraction and, thus, enhance the image comparison process.

In another embodiment, the program instructions are configured to cause the one or more processors 108 to identify one or more metrology sites within the portion of the first pattern type proximate to a location of the one or more local differences within the portion of the first pattern type. For example, as shown in FIG. 4A and FIG. 4B, the one or more processors 108 may identify the locations 406 and 416 respectively as locations for metrology (e.g., CD metrology measurements of pattern structures).

It is noted that while the above description has focused on a first pattern type, this designation is provided merely for purposes of simplicity and clarity. It is noted that the scope of the present disclosure is in no way limited to "a first pattern type" and can be extended to any number of additional pattern types. In this regard, the program instructions may cause the one or more processors 108 to acquire image data from two or more varied instances of an additional pattern type grouped in an additional group of the set of pattern groups. Then, the program instructions may cause the one or more processors to compare two or more images obtained from one or more common structures of the two or more instances of the additional pattern type to identify one or more local differences within a portion of the additional pattern type. Further, the program instructions may cause the one or more processors 108 to identify one or more metrology sites within the portion of the additional pattern type proximate to a location of the one or more local differences within the portion of the additional pattern type.

The one or more processors 108 of controller 106 may include any one or more processing elements known in the art. In this sense, the one or more processors 108 may include any microprocessor-type device configured to execute software algorithms and/or instructions. In one embodiment, the one or more processors 108 may consist of a desktop computer, mainframe computer system, workstation, image computer, parallel processor, or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. In general, the term "processor" may be broadly defined to encompass any device having one or more processing elements, which execute program instructions from a non-transitory memory medium 110. Moreover, different subsystems of the system 100 (e.g., inspection tool 102, review tool 103, display or user interface) may include processor or logic elements suitable for carrying out at least a portion of the steps described throughout the present disclosure. Therefore, the above description should not be interpreted as a limitation on the present disclosure but merely an illustration.

The memory medium 110 may include any storage medium known in the art suitable for storing program instructions executable by the associated one or more processors 108. For example, the memory medium 110 may include a non-transitory memory medium. For instance, the memory medium 110 may include, but is not limited to, a read-only memory, a random access memory, a magnetic or optical memory device (e.g., disk), a magnetic tape, a solid state drive, and the like. In another embodiment, the medium 110 is configured to store one or more results from the inspection system 100 and/or the output of the various steps described herein. It is further noted that medium 110 may be housed in a common controller housing with the one or more processors 108. In an alternative embodiment, the medium 110 may be located remotely with respect to the physical location of the processors and controller 106.

In another embodiment, the system 100 includes a user interface. In one embodiment, the user interface is communicatively coupled to the one or more processors 108 of controller 106. In another embodiment, the user interface may be utilized by controller 106 to accept selections and/or instructions from a user. In some embodiments, a display may be used to display data to a user. In turn, a user may input selection and/or instructions responsive to data displayed to the user via the display device.

The user interface device may include any user interface known in the art. For example, the user interface may include, but is not limited to, a keyboard, a keypad, a touchscreen, a lever, a knob, a scroll wheel, a track ball, a switch, a dial, a sliding bar, a scroll bar, a slide, a handle, a touch pad, a paddle, a steering wheel, a joystick, a bezel mounted input device, or the like. In the case of a touchscreen interface device, those skilled in the art should recognize that a large number of touchscreen interface devices may be suitable for implementation in the present invention. For instance, the display device may be integrated with a touchscreen interface, such as, but not limited to, a capacitive touchscreen, a resistive touchscreen, a surface acoustic based touchscreen, an infrared based touchscreen, or the like. In a general sense, any touchscreen interface capable of integration with the display portion of a display device is suitable for implementation in the present disclosure.

The display device may include any display device known in the art. In one embodiment, the display device may include, but is not limited to, a liquid crystal display (LCD), an organic light-emitting diode (OLED) based display or a CRT display. Those skilled in the art should recognize that a variety of display devices may be suitable for implementation in the present disclosure and the particular choice of display device may depend on a variety of factors, including, but not limited to, form factor, cost, and the like. In a general sense, any display device capable of integration with a user interface device (e.g., touchscreen, bezel mounted interface, keyboard, mouse, trackpad, and the like) is suitable for implementation in the present disclosure.

In some embodiments, the system 100 described herein may be configured as a "stand alone tool" or a tool that is not physically coupled to a process tool. In other embodiments, such an inspection/review system may be coupled to a process tool (not shown) by a transmission medium, which may include wired and/or wireless portions. The process tool may include any process tool known in the art such as a lithography tool, an etch tool, a deposition tool, a polishing tool, a plating tool, a cleaning tool, or an ion implantation tool. The results of inspection, review, and/or metrology performed by the systems described herein may be used to alter a parameter of a process or a process tool using a feedback control technique, a feedforward control technique, and/or an in situ control technique. The parameter of the process or the process tool may be altered manually or automatically.

The embodiments of the system 100 illustrated in FIG. 1 may be further configured as described herein. In addition, the system 100 may be configured to perform any other step(s) of any of the method embodiment(s) described herein.

Figure 5:
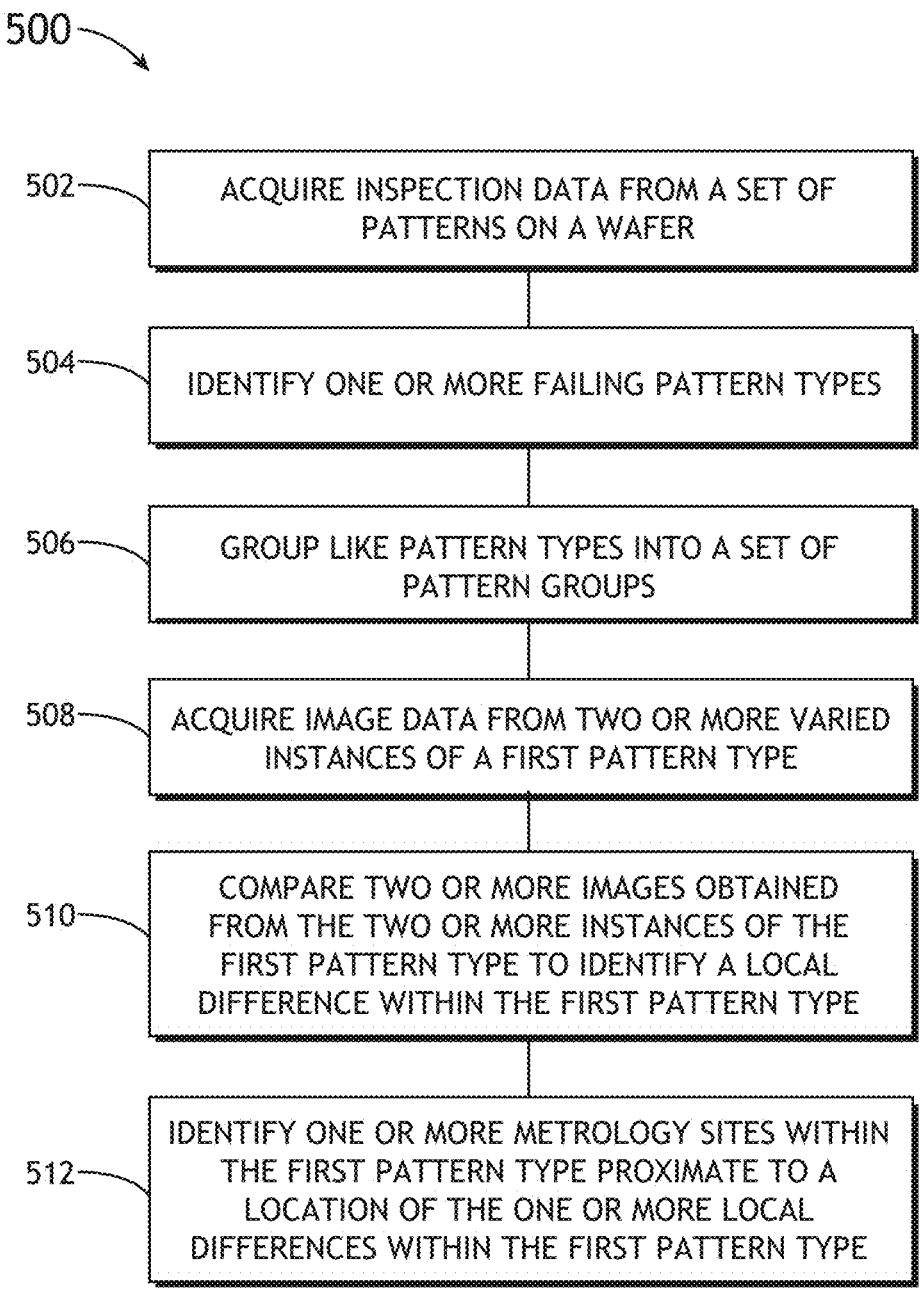
FIG. 5 illustrates a process flow diagram depicting a method of weak pattern quantification, in accordance with one or more embodiments of the present disclosure.

FIG. 5 illustrates a flow diagram depicting steps performed in a method 500 of quantification of weak patterns on a semiconductor wafer, in accordance with one embodiment of the present disclosure. It is noted herein that the steps of method 500 may be implemented all or in part by system 100. It is further recognized, however, that the method 500 is not limited to the system 100 in that additional or alternative system-level embodiments may carry out all or part of the steps of method 500.

In step 502, inspection data 112 is acquired from a set of patterns on a wafer. In one embodiment, the inspection data 112 is acquired for a set of patterns on wafer 104. The inspection data 112 is then transmitted from the inspection tool 102 to the controller 106 via one or more data transmission links (e.g., wireless data transmission link or wireline data link). For example, the inspection data 112 may be transmitted to the one or more processors 108 and/or memory 110 of controller 106 for analysis and/or storage.

In one embodiment, as shown in FIG. 1, the inspection data is acquired with an inspection tool 102. For example, the inspection tool 102 may include, but is not limited to, an optical inspection tool. For instance, the inspection tool 102 may include, but is not limited to, a broadband plasma inspection tool (e.g., inspection tool with a laser sustained plasma (LSP) broadband light source). By way of another example, the inspection tool 102 may include, but is not limited to, an electron-beam inspection tool. For instance, the inspection tool 102 may include, but is not limited to, an SEM-based inspection tool.

In step 504, one or more failing pattern types are identified on the wafer 104. For example, the one or more processors 108 of the controller 106 may identify one or more failing pattern types of the wafer 104 based on the inspection data 112. In one embodiment, one or more failing or weak patterns are identified utilizing die-to-die based inspection techniques. Further, the one or more processors 108 may store the one or more failing pattern types in memory 110. In one embodiment, the failing pattern types may be identified during process window discovery. It is noted that a given hot spot inspection process may yield a large number of defect spots (e.g., 1-2 million). In one embodiment, the defect locations may be overlaid with corresponding design data (e.g., design clip).

In step 506, like or similar pattern types of the one or more failing pattern types identified in step 504 are grouped into a set of pattern groups. For example, the one or more processors 108 of the controller 106 may group like pattern types of the one or more failing pattern types into a set of pattern groups. Further, the one or more processors 108 may store the pattern groups in memory 110.

In one embodiment, the one or more processors 108 may carry out the grouping process by performing a design-based binning (DBB) process. For example, the DBB process (e.g., unsupervised design based binning) may group like pattern types of the one or more failing pattern types identified in step 504 into a set of pattern groups. Design data and design-based binning are described in U.S. Pat. No. 8,139, 843 to Kulkarni et al. issued on Mar. 20, 2012; U.S. Pat. No. 8,041,103 to Kulkarni et al. issued on Oct. 18, 2011; and U.S. Pat. No. 7,570,796 to Zafar et al. issued on Aug. 4, 2009, all of which are incorporated herein by reference.

In one embodiment, the one or more processors 108 identify a varied population of defects via the DBB process. This varied population may be obtained from the modulated wafer (e.g., modulated wafer in FIG. 2) or a production wafer. Once a varied population of defects, or failing patterns, is identified the process moves to step 508.

In step 508, image data from two or more varied instances of a first pattern type are acquired. For example, once varied instances of the defects or failing patterns are identified in step 506, the processor 108 may direct the SEM tool 103 to acquire image data from two or more varied instances from one or more pattern types. In one embodiment, the image data may be acquired from two or more varied instances of a first pattern type grouped in a first group of the set of patterns in step 506. For example, as shown in FIG. 1, the image data 113 from two or more varied instances of the first pattern type is acquired via the review tool 103. In one embodiment, the review tool 103 includes an SEM review tool.

The two or more varied instances of the first pattern type are formed under different conditions. For example, as shown in FIG. 3, multiple instances 301a-301d of a given pattern may be acquired with the review tool 103. The varied instances may include a nominal pattern 301a and one or more patterns 301b-301d formed under conditions (e.g., focus, dose, overlay, and the like) modulated relative to the nominal pattern 301a. It is further noted the modulated patterns 301b-301d are also formed under different conditions relative to one another such that the system 100 can analyze how the given pattern type is failing under the changing conditions (e.g., focus, dose, overlay, and the like).

As noted previously herein, the two or more varied instances of one or more pattern types may be acquired from a modulated wafer or a nominal/product wafer. For instance, as shown in FIG. 3, the varied instances of a given pattern type may be formed deliberately utilizing a modulated wafer 200, whereby patterns are formed under different conditions (e.g., focus, dose, overlay, and the like). In another instance, the varied instances of a given pattern type may be formed on a nominal wafer (e.g., product wafer), whereby patterns are formed on the wafer under different conditions due to the variations in wafer and process tool conditions.

It is noted that under the higher modulation conditions a pattern may start to fail completely. In addition, while near the edge of the process window a subtle critical dimension (CD) variation may occur. The level at which a CD variation becomes important is dependent on the use case of the particular device and level of variation of electrical performance that is acceptable for a particular circuit element.

In step 510, two or more images obtained from one or more common structures of the two or more instances of the first pattern type are compared to identify one or more local differences within the first pattern type. For example, the one or more processors 108 may compare two or more images obtained from one or more common structures of the two or more instances of the first pattern type. It is noted that the one or more processors 108 may apply any image comparison technique known in the art to compare the acquired images of the two or more instances of the first pattern type to identify one or more local differences within the first pattern type.

In one embodiment, the one or more processors 108 may execute an image subtraction process on images of one or more common structures obtained from two or more instances of the first pattern type. For example, as shown in FIG. 4A, image 404 may be subtracted from image 402 to identify the local difference 406 in the pattern. By way of another example, as shown in FIG. 4B, image 414 may be subtracted from image 412 to identify the local difference 416 in the pattern. In this regard, the comparison between a modulated image 404/414 and a nominal image 402/412 (or a comparison between two modulated images) makes it possible to identify the area or sub-areas of a design element that are varying, allowing for an automated measurement plan to be developed for such structures.

In one embodiment, the one or more processors 108 may execute a diversity sampling process on one or more common structures of the two or more instances of the first pattern type to identify one or more local differences within a portion of the first pattern type. For example, the one or more processors 108 may perform diversity sampling between an image obtained under nominal conditions (e.g., nominal focus, dose, or overlay conditions) and an image obtained under modulated conditions (e.g., focus, dose, or overlay conditions modulated relative to the nominal conditions).

In another embodiment, the image comparison process may be enhanced by one or more edge smoothing techniques to minimize pattern noise prior to image subtraction. For example, the one or more processors 108 may perform an image smoothing process on one or more of the images obtained from the two or more instances of the first pattern type. Then, the one or more processors 108 may compare the images obtained from one or more common structures within the two or more instances of the first pattern type to identify one or more local differences within the portion of the first pattern type. It is noted that an edge smoothing process may aid in eliminating pattern noise, such as line edge roughness (LER) in the images.

In step 512, one or more metrology sites are identified within the first pattern type. In one embodiment, one or more metrology sites are identified or selected at or proximate to location of local differences identified in step 510. For example, as shown in FIGS. 4A and 4B, a metrology site may be identified to correspond with the location of the local difference identified at locations 406 and 416 respectively.

In another embodiment, in order to further enhance the sampling of such sites, BBP signals or data may be used to identify pattern types that exhibit high level of difference even before processing SEM images. Additional information from a design rule check (DRC), mask rule check (MRC), a critical-area based ranking algorithm, patterning simulations or other form of pre-ranking can used to augment or improve the selection of patterns for metrology. For example, a location of the one or more identified metrology sites may be validated using a DRC, a MRC, or one or more simulation processes.

While the description above has discussed the acquisition of varied instances of a "first pattern type," this description is provided merely for illustrative purposes and should not be interpreted as a limitation on the scope of the present disclosure. It is noted that the method 500 may be extended to the acquisition and analysis of any number of pattern types. In one embodiment, the method 500 includes acquiring image data from two or more varied instances of an additional pattern type grouped in an additional group of the set of pattern groups. In another embodiment, the method 500 includes comparing two or more images obtained from one or more common structures of the two or more instances of the additional pattern type to identify one or more local differences within a portion of the additional pattern type. In another embodiment, the method 500 includes identifying one or more metrology sites within the portion of the additional pattern type proximate to a location of the one or more local differences within the portion of the additional pattern type.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A method comprising:
    acquiring inspection data from a set of patterns on a wafer;
    identifying one or more failing pattern types on the wafer based on the acquired inspection data;
    grouping like pattern types of the one or more failing pattern types into a set of pattern groups;
    acquiring image data from two or more varied instances of a first pattern type grouped in a first group of the set of pattern groups, wherein the two or more varied instances of the first pattern type are formed with different conditions, wherein the different conditions include at least one of focus, dose, or overlay;
    comparing two or more images obtained from one or more common structures of the two or more instances of the first pattern type to identify one or more local differences within a portion of the first pattern type; and
    identifying one or more metrology sites within the portion of the first pattern type proximate to a location of the one or more local differences within the portion of the first pattern type.

2. The method of claim 1, further comprising:
    acquiring image data from two or more varied instances of an additional pattern type grouped in an additional group of the set of pattern groups;
    comparing two or more images obtained from one or more common structures of the two or more instances of the additional pattern type to identify one or more local differences within a portion of the additional pattern type; and
    identifying one or more metrology sites within the portion of the additional pattern type proximate to a location of the one or more local differences within the portion of the additional pattern type.

3. The method of claim 2, further comprising:
    generating a metrology sampling plan based on the identified one or more metrology sites within the portion of the first pattern type and the identified one or more metrology sites within the portion of the additional pattern type.

4. The method of claim 1, wherein the acquiring inspection data from a set of patterns on a wafer comprises:
    acquiring inspection data from a set of patterns on a wafer with a broadband inspection tool.

5. The method of claim 4, wherein the acquiring inspection data from a set of patterns on a wafer with a broadband inspection tool comprises:
    acquiring inspection data from a set of patterns on a wafer with a broadband plasma inspection tool.

6. The method of claim 4, wherein the acquiring inspection data from a set of patterns on a wafer with a broadband inspection tool comprises:
    acquiring inspection data from a set of patterns on a wafer with a scanning electron microscope (SEM).

7. The method of claim 1, wherein the grouping like pattern types of the one or more failing pattern types into a set of pattern groups comprises:
    performing a design based binning (DBB) process to group like pattern types of the one or more failing pattern types into a set of pattern groups.

8. The method of claim 1, wherein the acquiring image data from two or more varied instances of a first pattern type grouped in a first group of the set of pattern groups comprises:
    acquiring image data from two or more varied instances of a first pattern type grouped in a first group of the set of pattern groups with a review tool.

9. The method of claim 1, wherein the acquiring image data from two or more varied instances of a first pattern type grouped in a first group of the set of pattern groups with a review tool comprises:
    acquiring image data from two or more varied instances of a first pattern type grouped in a first group of the set of pattern groups with a scanning electron microscope (SEM).

10. The method of claim 1, wherein the two or more varied instances of a first pattern type comprise:
    a nominal pattern and at least one modulated pattern, wherein the at least one modulated pattern has one or more conditions modulated with respect to the nominal pattern.

11. The method of claim 1, wherein the two or more varied instances of the first pattern type are formed with at least one of different focus, different dose, or different overlay.

12. The method of claim 1, wherein the comparing two or more images obtained from one or more common structures of the two or more instances of the first pattern type to identify one or more local differences within a portion of the first pattern type comprises:
    performing a diversity sampling process on one or more common structures of the two or more instances of the first pattern type to identify one or more local differences within a portion of the first pattern type.

13. The method of claim 1, wherein the comparing two or more images obtained from one or more common structures of the two or more instances of the first pattern type to identify one or more local differences within a portion of the first pattern type comprises:
    performing an image smoothing process on one or more of the two or more images; and
    following the image smoothing process, comparing the two or more images obtained from one or more common structures of the two or more instances of the first pattern type to identify one or more local differences within the portion of the first pattern type.

14. The method of claim 1, wherein the comparing two or more images obtained from one or more common structures of the two or more instances of the first pattern type to identify one or more local differences within a portion of the first pattern type comprises:
    performing an image subtraction between two or more images obtained from one or more common structures of the two or more instances of the first pattern type via to identify one or more local differences within a portion of the first pattern type.

15. The method of claim 1, further comprising:
    validating a location of the one or more identified metrology sites with at least one of a design rule check (DRC), a mask rule check (MRC), or one or more simulation processes.

16. A method comprising:
    identifying one or more failing pattern types on a wafer;
    grouping like pattern types of the one or more failing pattern types into a set of pattern groups;
    comparing two or more images obtained from one or more common structures of two or more varied instances of a first pattern type to identify one or more local differences within a portion of the first pattern type, wherein the two or more varied instances of the first pattern type are formed with different conditions, wherein the different conditions include at least one of focus, dose, or overlay; and
    identifying one or more metrology sites within the portion of the first pattern type proximate to a location of the one or more local differences within the portion of the first pattern type.

17. A system comprising:
    an inspection tool;
    a review tool; and
    a controller including one or more processors configured to execute a set of program instructions maintained on a memory, the program instructions configured to cause the one or more processors to:
        direct the inspection tool to acquire inspection data from a set of patterns on a wafer;
        identify one or more failing pattern types on the wafer based on the acquired inspection data;
        group like pattern types of the one or more failing pattern types into a set of pattern groups;
        direct the review tool to acquire image data from two or more modulated instances of a first pattern type grouped in a first group of the set of pattern groups, wherein the two or more modulated instances of the first pattern type are formed with different conditions, wherein the different conditions include at least one of focus, dose, or overlay;
        compare two or more images obtained from one or more common structures of the two or more instances of the first pattern type to identify one or more local differences within a portion of the first pattern type; and
        identify one or more metrology sites within the portion of the first pattern type proximate to a location of the one or more local differences within the portion of the first pattern type.

18. The system of claim 17, wherein the inspection tool comprises:
    a broadband inspection tool.

19. The system of claim 18, wherein the inspection tool comprises:
    a broadband plasma inspection tool.

20. The system of claim 17, wherein the inspection tool comprises:
a scanning electron microscope (SEM) inspection tool.

21. The system of claim 17, wherein the review tool comprises:
a scanning electron microscope (SEM) review tool.

22. The system of claim 17, wherein the program instructions are further configured to cause the one or more processors to:
acquire image data from two or more varied instances of an additional pattern type grouped in an additional group of the set of pattern groups;
compare two or more images obtained from one or more common structures of the two or more instances of the additional pattern type to identify one or more local differences within a portion of the additional pattern type; and
identify one or more metrology sites within the portion of the additional pattern type proximate to a location of the one or more local differences within the portion of the additional pattern type.

23. The system of claim 22, wherein the program instructions are further configured to cause the one or more processors to:
generate a metrology sampling plan based on the identified one or more metrology sites within the portion of the first pattern type and the identified one or more metrology sites within the portion of the additional pattern type.

24. The system of claim 17, wherein the program instructions are configured to cause the one or more processors to group like pattern types of the one or more failing pattern types into a set of pattern groups by:
performing a design based binning (DBB) process to group like pattern types of the one or more failing pattern types into a set of pattern groups.

25. The system of claim 17, wherein the two or more varied instances of a first pattern type comprise:
a nominal pattern and at least one modulated pattern, wherein the at least one modulated pattern has one or more conditions modulated with respect to the nominal pattern.

26. The system of claim 17, wherein the two or more varied instances of the first pattern type are formed with at least one of different focus, different dose, or different overlay.

27. The system of claim 17, wherein the program instructions are configured to cause the one or more processors to compare two or more images obtained from one or more common structures of the two or more instances of the first pattern type to identify one or more local differences within a portion of the first pattern type by:
performing a diversity sampling process on one or more common structures of the two or more instances of the first pattern type to identify one or more local differences within a portion of the first pattern type.

28. The system of claim 17, wherein the program instructions are configured to cause the one or more processors to compare two or more images obtained from one or more common structures of the two or more instances of the first pattern type to identify one or more local differences within a portion of the first pattern type by:
performing an image smoothing process on one or more of the two or more images; and
following the image smoothing process, comparing the two or more images obtained from one or more common structures of the two or more instances of the first pattern type to identify one or more local differences within the portion of the first pattern type.

29. The system of claim 17, wherein the program instructions are configured to cause the one or more processors to compare two or more images obtained from one or more common structures of the two or more instances of the first pattern type to identify one or more local differences within a portion of the first pattern type by:
performing an image subtraction between two or more images obtained from one or more common structures of the two or more instances of the first pattern type to identify one or more local differences within a portion of the first pattern type.

30. The system of claim 17, wherein the program instructions are further configured to cause the one or more processors to:
validate a location of the one or more identified metrology sites with at least one of a design rule check (DRC), a mask rule check (MRC), or one or more simulation processes.

31. A system comprising:
a controller including one or more processors configured to execute a set of program instructions maintained on a memory, the program instructions configured to cause the one or more processors to:
direct an inspection tool to acquire inspection data from a set of patterns on a wafer;
identify one or more failing pattern types on the wafer based on the acquired inspection data;
group like pattern types of the one or more failing pattern types into a set of pattern groups;
direct a review tool to acquire image data from two or more modulated instances of a first pattern type grouped in a first group of the set of pattern groups, wherein the two or more modulated instances of the first pattern type are formed with different conditions, wherein the different conditions include at least one of focus, dose, or overlay;
compare two or more images obtained from one or more common structures of the two or more instances of the first pattern type to identify one or more local differences within a portion of the first pattern type; and
identify one or more metrology sites within the portion of the first pattern type proximate to a location of the one or more local differences within the portion of the first pattern type.

* * * * *